United States Patent
Won

(10) Patent No.: US 7,215,155 B2
(45) Date of Patent: May 8, 2007

(54) CONTROL CIRCUITS AND METHODS INCLUDING DELAY TIMES FOR MULTI-THRESHOLD CMOS DEVICES

(75) Inventor: Hyo-sig Won, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 234 days.

(21) Appl. No.: 10/996,084

(22) Filed: Nov. 23, 2004

(65) Prior Publication Data
US 2005/0168242 A1 Aug. 4, 2005

(30) Foreign Application Priority Data
Jan. 29, 2004 (KR) .................. 10-2004-0005598

(51) Int. Cl.
*H03K 19/096* (2006.01)
*H03K 3/037* (2006.01)
(52) U.S. Cl. .................. 326/98; 326/93; 327/201; 327/218
(58) Field of Classification Search .......... 326/82, 326/98
See application file for complete search history.

(56) References Cited

U.S. PATENT DOCUMENTS

| | | | |
|---|---|---|---|
| 5,933,384 A | 8/1999 | Terada et al. | |
| 5,978,948 A | 11/1999 | Ohta | |
| 6,140,836 A * | 10/2000 | Fujii et al. | ................ 326/35 |
| 6,433,584 B1 | 8/2002 | Hatae | |
| 6,639,455 B2 * | 10/2003 | Mizuno | ................ 327/544 |
| 7,080,270 B2 * | 7/2006 | Yokozeki et al. | ........... 713/320 |

OTHER PUBLICATIONS

Kumagi et al., *A Novel Powering-down Scheme for Low Vt CMOS Circuits*, 1998 Symposium on VLSI Circuits Digest of Technical Papers, 1998, pp. 44-45, no month.
Makino et al., *An Auto-Backgate-Controlled MT-CMOS Circuit*, 1998 Symposium on VLSI Circuits Digest of Technical Papers, 1998, pp. 42-43, no date, no month.
Mutoh et al., *1V High-Speed Digital Circuit Technology with 0.5 μm Multi-Threshold CMOS*, Proceedings of the Sixth Annual IEEE International ASIC Conference and Exhibit, Sep. 27-Oct. Oct. 1993, pp. 186-189.

(Continued)

*Primary Examiner*—Vibol Tan
(74) *Attorney, Agent, or Firm*—Myers Bigel Sibley & Sajovec, PA

(57) ABSTRACT

Multi-Threshold CMOS (MTCMOS) devices include a high threshold voltage current control switch that is responsive to a first control signal, a low threshold voltage logic circuit and a flip-flop that is configured to store data from the low threshold voltage logic circuit and that is responsive to a second control signal. A control circuit also is provided that is configured to change a logic state of the second control signal and then, after a first delay, to change a logic state of the first control signal, in response to the MTCMOS device entering a sleep mode. The control circuit is further configured to change the logic state of the first control signal and then, after a second delay that is different from the first delay, to change the logic state of the second control signal in response to the MTCMOS device entering an active mode. Related methods also are provided.

20 Claims, 6 Drawing Sheets

OTHER PUBLICATIONS

Mutoh et al., *1V Power Supply High-Speed Digital Circuit Technology with Multithreshold-Voltage CMOS*, IEEE Journal of Solid-State Circuits, vol. 30, No. 8, Aug. 1995, pp. 847-854, no date.

Mutoh et al., *A 1-V Multithreshold-Voltage CMOS Digital Signal Processor for Mobile Phone Application*, IEEE Journal of Solid-State Circuits, vol. 31, No. 11, Nov. 1996, pp. 1795-1802, no date.

Shigematsu et al., *A 1-V high-speed MTCMOS circuit scheme for power-down applications*, 1995 Symposium on VLSI Circuits Digest of Technical Papers, 1995, pp. 125-126, no date & no month.

Shigematsu et al., *A 1-V High-Speed MTCMOS Circuit Scheme for Power-Down Application Circuits*, IEEE Journal of Solid-State Circuits, vol. 32, No. 6, Jun. 1997, pp. 861-869, no date.

* cited by examiner

CONTROL CIRCUITS AND METHODS INCLUDING DELAY TIMES FOR MULTI-THRESHOLD CMOS DEVICES

RELATED APPLICATION

This application claims the benefit under 35 U.S.C. § 119 of Korean Patent Application No. 2004-0005598, filed on Jan. 29, 2004, the disclosure of which is hereby incorporated herein by reference in its entirety as if set forth fully herein.

FIELD OF THE INVENTION

The present invention relates to Multi-Threshold Complementary Metal Oxide Semiconductor (MTCMOS) devices, and more particularly to circuits and methods for controlling MTCMOS devices.

BACKGROUND OF THE INVENTION

Multi-Threshold Complementary Metal Oxide Semiconductor (MTCMOS) technology is being widely used for low power integrated circuit devices. In particular, it is known that power dissipation of an integrated circuit device may be reduced by reducing the power supply voltage thereof. Unfortunately, a reduction in power supply voltage may reduce the speed of the transistors of the device. Accordingly, it is known to reduce the threshold voltage ($V_{th}$) of the transistors to at least partially overcome this speed reduction. Unfortunately, a reduction in threshold voltage may increase the leakage or standby current of the transistors when they are in the "off" state, which may thereby increase power consumption when the device is in a standby state.

MTCMOS technology can overcome this potential increase in standby current by utilizing low threshold voltage transistors for logic operations of the device and by supplying power supply and/or ground voltages to the logic gates through transistors which have a high threshold voltage. When the high threshold voltage transistors are turned on to supply the power supply voltages to the logic gates, the low threshold voltage transistors can be operated at high speed because of their low threshold voltages. However, in standby mode, the high threshold voltage transistors may be turned off to thereby cut off the low voltage threshold transistors from their power supply voltages and thereby reduce or eliminate leakage current through the low threshold voltage transistors.

In some embodiments, MTCMOS devices have a configuration in which a MOS switch with a comparatively high threshold voltage is connected in series between a power supply and a logic circuit. It will be understood by those having skill in the art that as used herein, the term "MOS" refers to any insulated gate field effect transistor, the gate of which comprises metal and/or nonmetal (such as polysilicon) and the insulator of which comprises oxide and/or other insulators (such as high dielectric constant insulators).

MTCMOS technology can reduce or minimize the power consumption of a system by turning on the MOS switch to supply power to the logic circuit in an active mode and turning it off to interrupt the power to the logic circuit in a sleep mode. Thus, this technology may be used for reducing power consumption of a circuit used in a system in which the sleep mode is longer than the active mode.

However, if a transition when the power is interrupted is not provided properly, a virtual ground voltage level of the MTCMOS circuit may float during the sleep mode, and data stored in a latch circuit or flip-flop circuit connected to the MTCMOS circuit may be lost. Therefore, in order to properly operate the MTCMOS circuit, a flip-flop circuit for storing data in the sleep mode and a control circuit for controlling the MTCMOS device may be provided.

SUMMARY OF THE INVENTION

Some embodiments of the present invention provide MTCMOS devices that include a high threshold voltage current control switch that is responsive to a first control signal, a low threshold voltage logic circuit and a flip-flop that is configured to store data from the low threshold voltage logic circuit and that is responsive to a second control signal. A control circuit also is provided that is configured to change a logic state of the second control signal and then, after a first delay, to change a logic state of the first control signal, in response to the MTCMOS device entering a sleep mode. The control circuit is further configured to change the logic state of the first control signal and then, after a second delay that is different from the first delay, to change the logic state of the second control signal in response to the MTCMOS device entering an active mode. In some embodiments the second delay is longer than the first delay. Moreover, analogous method embodiments also may be provided.

Other embodiments of the present invention provide an MTCMOS device having an MTCMOS control circuit configured to control output of control signals that control the operations of a flip-flop portion that stores data and configured to control a current switch when entering sleep mode and returning to an active mode during the operation of the MTCMOS device.

According to some embodiments of the present invention, there is provided an MTCMOS control circuit for controlling an MTCMOS device. The MTCMOS control circuit outputs a first control signal for controlling the switching of a current control switch of a high voltage and a second control signal for controlling a flip-flop for storing data of a logic circuit block according to a sleep mode of the MTCMOS device. The control circuit is configured to change a logic state of the second control signal from a first logic state to a second logic state and a logic state of the first control signal from the second logic state to the first logic state after a predetermined delay time tD1, when the MTCMOS device is converted to the sleep mode. When the MTCMOS device is converted to an active mode, the control circuit is configured to change the logic state of the first control signal from the first logic state to the second logic state and to change a logic state of the second control signal from the second logic state to the first logic state after a predetermined delay time tD2.

The MTCMOS control circuit may respond to predetermined wakeup signals EXTWKU and RTCWKU to convert the MTCMOS device into the active mode, and may respond to a predetermined stop signal STOP_ON to convert the MTCMOS device into the sleep mode.

In the MTCMOS control circuit, the first control signal may turn the current control switch on in the second logic state, and may turn the current control switch off in the first logic state. The second control signal may store data of the logic circuit via the flip-flop in the second logic state, and may disable the flip-flop in the first logic state.

The MTCMOS control circuit may include a first buffer receiving the external stop signal STOP_ON; a first delay circuit delaying a signal output from the first buffer; a first OR gate receiving the first external wakeup signal EXTWKU and the second external signal wakeup signal RTCWKU; a first inverter receiving a signal output from the first OR gate; and a second delay circuit delaying a signal output from the first inverter. A first control signal output block outputs the first control signal, which is obtained by performing at least one logic operation such as an OR operation on the stop signal STOP_ON and an output signal of the first delay circuit. A second control signal output block outputs the second control signal, which is obtained by performing at least one logic operation such as an AND operation on the stop signal and an output signal of the second delay circuit.

In some embodiments of the MTCMOS control circuit, the first delay circuit may be formed of one flip-flop, and the second delay circuit may be formed of multiple flip-flops connected in series.

In some embodiments of the MTCMOS control circuit, the first control signal output block may include a first AND gate receiving the stop signal and an output signal of the first delay circuit; a first NAND gate receiving output signals of the first AND gate and the first inverter; and a second OR gate that outputs the first control signal by receiving an output signal of the first NAND gate and two predetermined control signals.

In some embodiments of the MTCMOS control circuit, the second control signal output block may include a second AND gate receiving the stop signal and an output signal of the first buffer; a third AND gate receiving output signals of the second AND gate and the second delay circuit; and a forth AND gate that outputs the second control signal by receiving an output signal of the third AND gate and two predetermined control signals.

In some embodiments of the MTCMOS control circuit, the first control signal output block may include a first AND gate receiving the stop signal and an output signal of the first delay circuit; a first NAND gate receiving output signals of the first AND gate and the first inverter; and a second OR gate that outputs the first control signal by receiving an output signal of the first NAND gate and two predetermined control signals.

In some embodiments of the MTCMOS control circuit, the second control signal output block may include a second AND gate receiving the stop signal and an output signal of the first buffer; a third AND gate receiving output signals of the second AND gate and the second delay circuit; and a forth AND gate that outputs the second control signal by receiving an output signal of the third AND gate and two predetermined control signals.

According to other embodiments of the present invention, there is provided an MTCMOS control circuit for controlling an MTCMOS device. The MTCMOS control circuit outputs a first control signal SC for controlling the switching of a current control switch of a high voltage and a second control signal SCB for controlling the flip-flop block for storing data of a logic circuit block according to a sleep mode of the MTCMOS device. The control circuit is configured to transfer the second control signal from a first logic state to a second logic state when the MTCMOS device is converted into the sleep mode and to transfer the first control signal from the second logic state to the first logic state after a predetermined delay time tD1. The MTCMOS control circuit includes a timing control circuit for transferring the first control signal from the first logic state to the second logic state when the MTCMOS device is converted into the active mode and transferring the second control signal from the second logic state to the first logic state; and an initialization control circuit for initializing a reset flip-flop, the first control signal to the second logic state via signals output from the reset flip-flop, and the second control signal to the first logic state, upon initialization of the MTCMOS device.

According to another aspect of the present invention, there is provided a method of controlling an active mode of an MTCMOS device, including producing predetermined wakeup signals EXTWKU and RTCWKU including a pulse in a second logic state having a predetermined width; transferring a first control signal controlling a current flow of the MTCMOS device to the second logic state in response to the predetermined wakeup signals; transferring a second control signal for controlling a flip-flop block for storing data of a logic circuit block of the MTCMOS device after a predetermined delay time from when the first control signal is transferred to the second logic state; and transferring a stop signal STOP_ON converting the MTCMOS device to a sleep mode, to the first logic state.

According to another aspect of the present invention, there is provided a method of controlling a sleep mode of a MTCMOS device, including transferring a stop signal STOP_ON converting the MTCMOS device to a sleep mode; transferring a second control signal controlling a flip-flop for storing data of a logic circuit block of the MTCMOS device in response to the stop signal; and transferring a first control signal controlling a current flow of the MTCMOS device after a predetermined delay time from when the second control signal is transferred to the second logic state.

DETAILED DESCRIPTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Moreover, each embodiment described and illustrated herein includes its complementary conductivity type embodiment as well. Complementary logic states from those described also may be provided It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first gate could be termed a second gate, and, similarly, a second gate could be termed a first gate without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes" and/or "including", specify the presence of stated features, regions, steps, operations, elements, and/or components, but do not preclude the presence or addition of one or more other features, regions, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
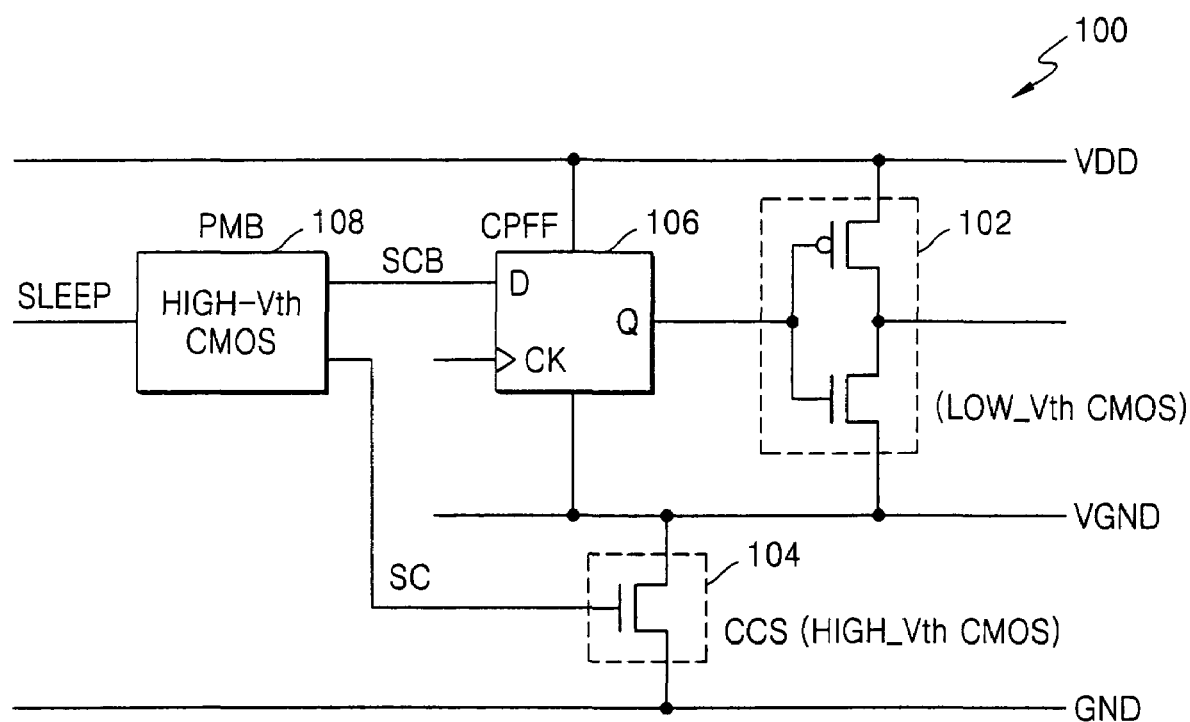
FIG. 1 is a block diagram illustrating a configuration of a conventional MTCMOS device.

FIG. 1 is a block diagram illustrating a configuration of a conventional MTCMOS device.

Referring to FIG. 1, an MTCMOS device 100 includes a logic circuit block 102 (also referred to herein as a "low threshold voltage logic circuit" or simply as a "logic circuit") between a power source voltage VDD, which is a first power source voltage and a virtual ground voltage VGND which is an operational voltage, and a MOS switch 104 (also referred to herein as a "high threshold voltage circuit control switch") switching the operation of the MTCMOS device 100 between the virtual ground voltage VGND and a ground voltage GND, which is a second power source voltage. Also, the MTCMOS device 100 includes a flip-flop block 106 (also referred to herein simply as a "flip-flop") storing data of a logic circuit block 102 and a power management block (PMB) 108 managing the power of the MTCMOS device 100.

The MTCMOS device 100 is configured such that the MOS switch 104 with a comparatively high threshold voltage Vth, is interposed between the power source voltage VDD and/or the ground voltage GND, and the logic circuit block 102. When the circuit of the logic circuit block 102 operates, in other words, in an active mode, the MOS switch 104 is turned on to supply the power source voltage VDD or the ground voltage GND to the logic circuit block 102 with the comparatively low threshold voltage Vth in order to allow improved operational speed of the logic circuit block 102. When the circuit of the logic circuit block 102 is not used, in other words, in a sleep mode, the MOS switch 104 is turned off to interrupt the power source voltage VDD and/or the ground voltage GND to the logic circuit block 102 in order to reduce a leakage current of the logic circuit block 102 so as to reduce or minimize the power consumption of the entire system.

Also, although the MOS switch 104 may expand the size of an MTCMOS device, the MTCMOS device may be realized by changing a design flow without needing a large difference in the entire design process.

The MTCMOS device 100 is capable of reducing the power consumption of a portable device having a sleep mode that is longer than an active mode. However, when the MOS switch 104 is turned off, data stored in the logic circuit block 102 may be lost. To solve the loss of data stored in the logic circuit block 102, there are methods such as a conventional MTCMOS FF method as described in S. Mutoh, et al., *1V High-Speed Digital Circuit Technology with 0.5 mm Multi-threshold-Voltage CMOS*, IEEE Int. ASIC Conf., September, pp. 186–189. 1993; and S. Mutoh, et al., *A 1-V Power Supply High-Speed Digital Circuit Technology with Multi-threshold-Voltage CMOS*, IEEE JSSC, Vol. 30. No. 8, pp. 847–853, 1995; a Balloon FF method described in S. Shigematsu, et al., *A 1-V High-Speed MTCMOS Circuit Scheme for Power-Down Applications*, VLSI Symp., pp. 125–126, 1995; S. Mutoh, et al., *A 1-V Multi-threshold-Voltage CMOS Digital Signal Processor for Mobile Phone Application*, IEEE JSSC, Vol. 31. No. 11, pp. 1795–1802, 1996; and S. Shigematsu, et al., *A 1-V High-Speed MTCMOS Circuit Scheme for Power-Down Application Circuit*, IEEE JSSC, Vol. 32. No. 6, pp. 861–869, 1997; an ABC (Auto Backgate Controlled)-MTCMOS method described in H. Makino, et al., *An Auto-Backgate-Controlled MT-CMOS Circuit*, VLSI Symp., pp. 42–43, 1998; VRC (Virtual power/ground Rail Clamp) method described in K. Kumagai, et al., *A Novel Powering-Down Scheme for Low Vt CMOS Circuit*, VLSI Symp., pp. 44–45, 1998; and CPFF (Complementary Pass-transistor Flip Flop) method described in K. T. Park, H. S. Won et. al, *A New Low-Power Edge-Triggered and Logic-Embedded FF Using Complementary Pass-Transistors Circuit*, ITC-CSCC, 2001. Compared to the above methods, the CPFF method may provide desirable area, speed, and/or electric power consumption.

Figure 2:
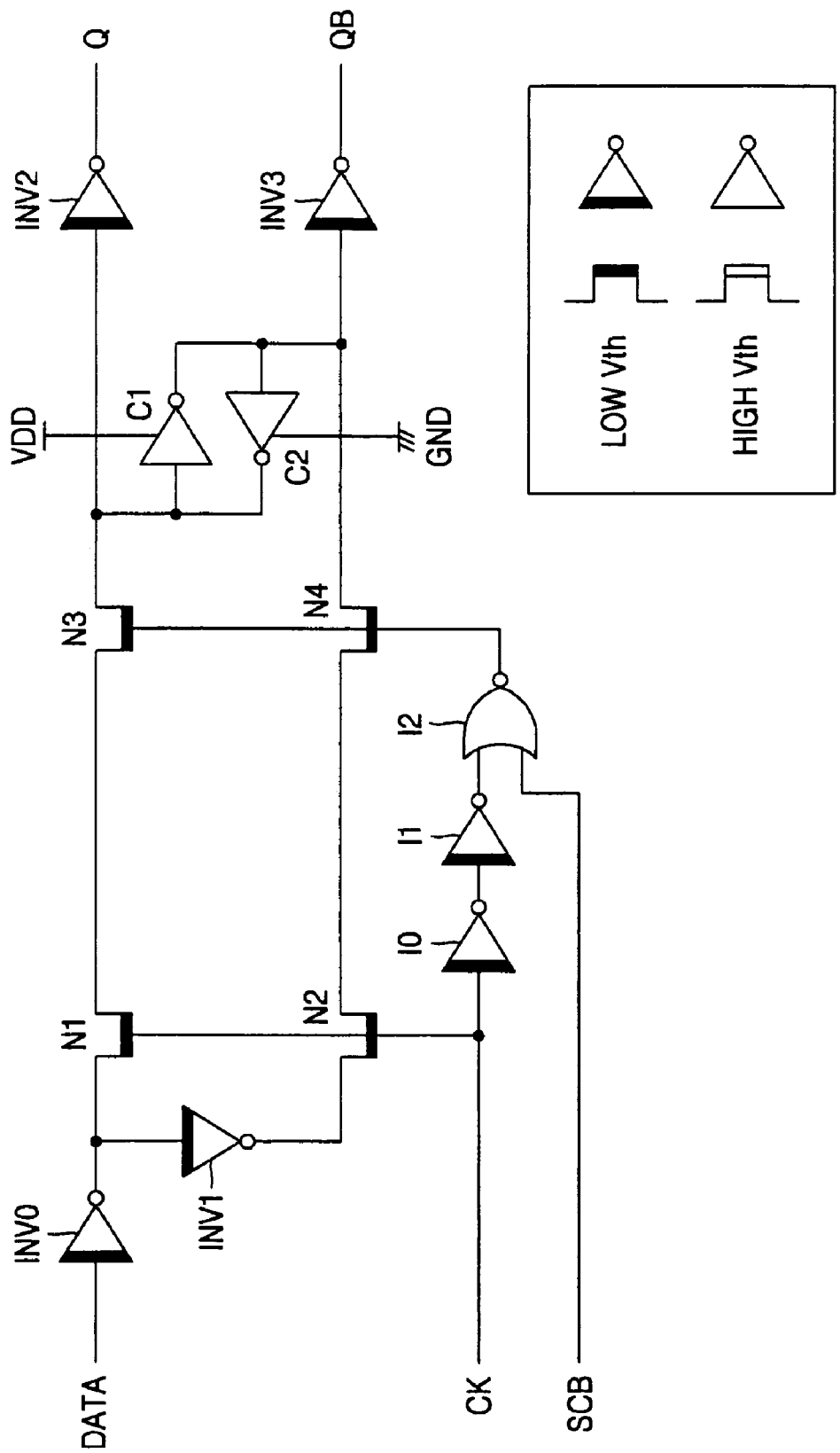
FIG. 2 is a circuit diagram illustrating an embodiment of a Complementary Pass transistor based flip-flop (CPFF) in FIG. 1.

FIG. 2 is a circuit diagram illustrating an embodiment of a complementary pass transistor-based flip-flop (CPFF) such as CPFF 106 of FIG. 1.

In the case of the Balloon FF, a complicated control circuit may be used for controlling a flip-flop when the flip-flop is converted into a sleep mode or an active mode. A control method and circuit may be designed differently according to the type of flip-flop of a logic circuit block. The CPFF shown in FIG. 2 can have a small volume to consume low electric power and can operate at high speeds, and does not require an additional circuit to be installed for storing data latched when the CP flip-flop is used as an element of an MTCMOS system interrupting the power source.

The CPFF shown in FIG. 2 perceives any delay between a clock signal CLK and a delayed version of clock signal delaying the clock signal CLK, receives input data during the time corresponding to the delay, and latches previous input data until new input data is received. With a CPFF of FIG. 2, a design of timing to preserve data can be very simple compared to a conventional flip-flop.

The PMB 108 of FIG. 1 outputs a first control signal SC for controlling the MOS switch (or CCS cell) 104 and a second control signal for SCB controlling the CPFF 106.

An MTCMOS device control circuit for controlling initialization, and a conversion from a sleep mode to an active mode of the MTCMOS device 100 of FIG. 1 in the PMB 108 may be included for operating the MTCMOS device 100.

Figure 3:
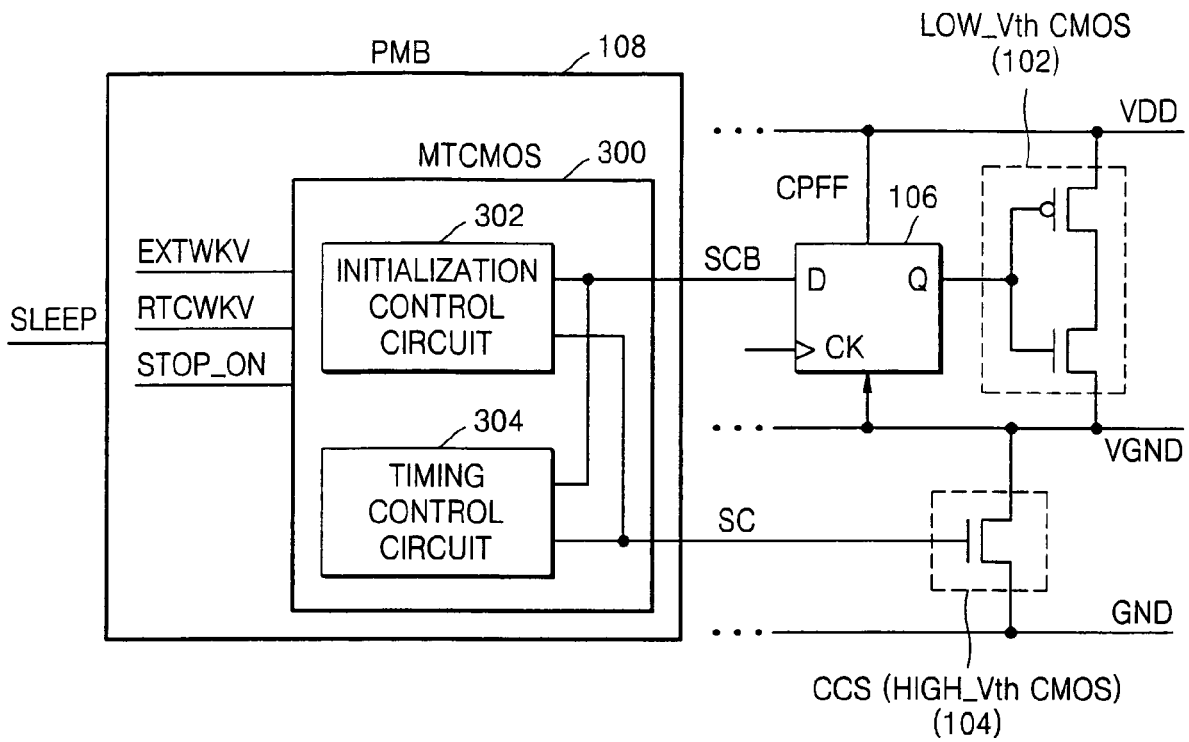
FIG. 3 is a block diagram illustrating an MTCMOS device including a control circuit according to exemplary embodiments of the present invention.

FIG. 3 is a block diagram illustrating an MTCMOS device including a control circuit according to exemplary embodiments of the present invention.

Referring to FIG. 3, an MTCMOS control circuit 300 includes an initialization control circuit 302 that is used in the initialization of an MTCMOS device, and a timing control circuit 304 that is used in conversion of a sleep mode to an active mode. Also, the MTCMOS control circuit 300 receives control signals EXTWKU, RTCWKU, and STOP_ON that are provided in the PMB 108, outputs a first control signal SC via OR operation, and outputs a second control signal SCB via at least one logical operation of signals output from the initialization control circuit 302 and the timing control circuit 304, and other signals in the PMB. It will be understood that the logic block 102 is illustrated in FIG. 3 as a single inverter. However, more complicated logic blocks also may be provided in MTCMOS devices.

Figure 4:
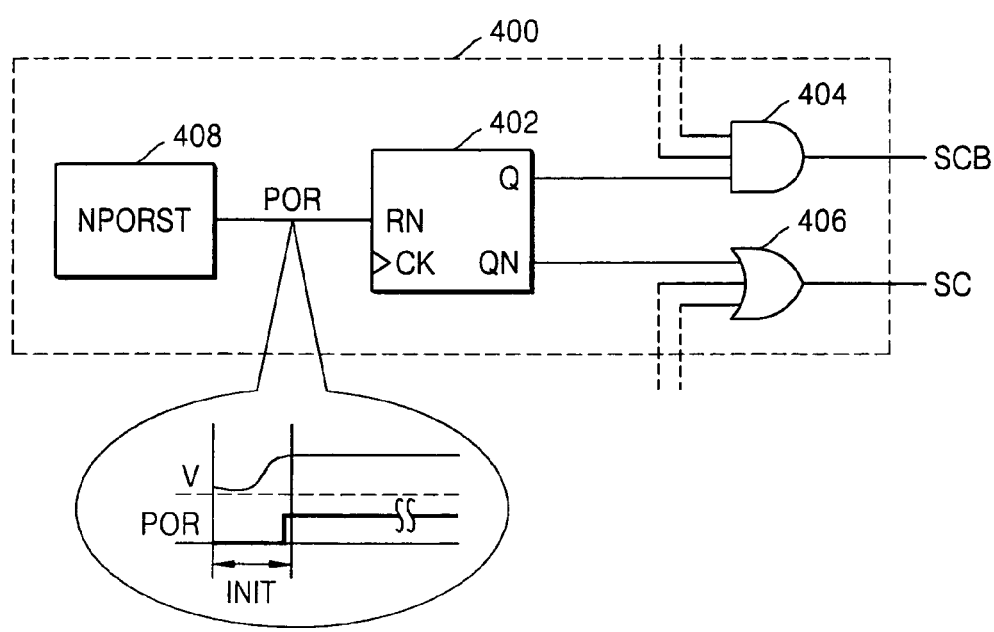
FIG. 4 is a circuit diagram illustrating an initialization control circuit according to exemplary embodiments of the invention.

FIG. 4 is a circuit diagram illustrating an initialization control circuit 400 for the initialization of an MTCMOS device, which may correspond to the initialization control circuit 302 of FIG. 3.

The initialization control circuit 400 shown in FIG. 4 is configured to control the initialization of an MTCMOS device. When an MTCMOS chip is initially powered up, the initialization control circuit 400 resets a reset flip-flop 402 using a power-on-reset POR signal in order to initialize the first control signal SC as a high level and the second control signal SCB as a low level.

Referring to FIG. 4, the initialization control circuit 400 includes the reset flip-flop 402, an AND gate 404, an OR gate 406, and a power-on-reset circuit 408. An input port of the reset flip-flop 402 is connected to an output port of the power-on-reset circuit NPORST 408 and output ports Q and QN of the reset flip-flop 402 are connected to the AND gate 404 and the OR gate 406, respectively. An output of an AND gate 404 provides the second control signal SCB and an output of the OR gate 406 provides the first control signal SC.

When the MTCMOS circuit is powered-on, other input signals of the AND gate 404 and the OR gate 406 are fixed at low levels or high levels.

An input signal of the reset flip-flop 402 is provided by an output signal of the power-on-reset circuit 408. When a power voltage VDD is greater than a predetermined voltage, the output signal of the power-on-reset circuit 408 is converted from a first logic state (e.g., low level) to a second logic state (e.g., high level). The output signal initializes the reset flip-flop 402.

The first output signal Q and the second output signal QN of the reset flip-flop 402 go into the first logic state (e.g., low level) and the second logic state (e.g., high level), respectively. Accordingly, the first output signal Q of the reset flip-flop 402 is applied as the input signal of the AND circuit 404. Thus, the second control signal SCB of the AND circuit 404 is kept in the second state and is connected to an input signal of a flip-flop CPFF 106 of the MTCMOS device.

The second output signal QN of the reset flip-flop 402 is applied to the OR circuit 406, thereby keeping the first control signal SC, provided by an output of OR gate 406, in the second logic state (e.g., high level). Also, when the MTCMOS circuit is initialized, other signals of the AND gate 404 are fixed at the second logic state and other input signals of the OR circuit 406 are fixed at the first logic state.

The timing control circuit 304 controlling the timing of the first and second control signals when the MTCMOS chip enters a sleep mode or an active mode is also provided in the MTCMOS control circuit 300.

The timing control circuit 304 controls a timing relation by setting a proper delay time between the first control signal and the second control signal so that data is stored in the CPFF 106 prior to the MTCMOS device entering the sleep mode. Also, when the MTCMOS device enters the active mode, the timing control circuit 304 controls the timing relation by setting a proper delay time between the first control signal SC and the second control signal SCB so that the logic circuit block 102 of the MTCMOS device may use the data stored in the CPFF 106.

Figure 5:
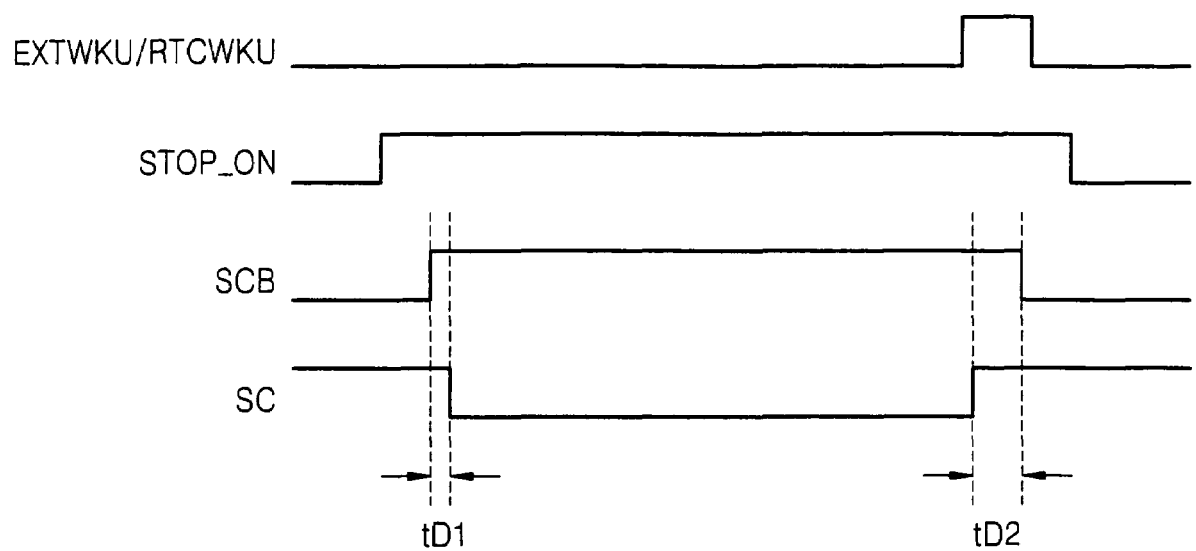
FIG. 5 is a timing diagram illustrating an input/output signal of a timing control circuit according to exemplary embodiments of the present invention.

FIG. 5 is a timing diagram illustrating input/output signals of a timing control circuit according to exemplary embodiments of the present invention.

Referring to FIG. 5, FIG. 5 illustrates a timing relation of the input signals EXTWKU, RTCWKU, and STOP_ON input to the MTCMOS control circuit 300 of FIG. 3 and the control signals SC and SCB output from the MTCMOS control circuit 300.

When the MTCMOS device is converted from an active mode to a sleep mode, two external wakeup signals, EXTWKU and RTCWKU, stay in a first logic state (e.g., low level), and a predetermined stop signal STOP_ON, signaling for the MTCMOS device to enter the sleep mode, is transferred from the first logic state (e.g., low level) to a second logic state (e.g. high level). In response, the timing control circuit 304 transfers the second control signal SCB that controls the CPFF, from the first logic state to the second logic state and outputs the second control signal SCB. Further, after a first delay time tD1, the timing control circuit 304 transfers the first control signal SC, which controls a MOS switching block CCS 104 of FIG. 3 from the second logic state to the first logic state.

Then, the second control signal SCB enters the second logic state and data stored in the latch or the flip-flop of a logic circuit block 102 of the MTCMOS device may be stored in the CPFF 106. After the first delay time tD1, the first control signal SC goes into the first logic state, the MOS switching block CCS 104 is turned off, and the MTCMOS device is transferred to the sleep mode.

Thus, before the MTCMOS device is transferred to the sleep mode, the data of the logic circuit block 102 may be stored in the CPFF 106.

When the MTCMOS device is converted from the sleep mode into the active mode, two external wakeup signals, EXTWKU and RTCWKU, are converted from the first logic state into a pulse signal having the second logic state and input to the MTCMOS control circuit in order to convert the MTCMOS device into the active mode. Then, the timing control circuit 304 transfers the first control signal SC, which controls the MOS switching block, from the first logic state to the second logic state, such that the first control signal SC turns the MOS switching block on, and outputs the first control signal SC. After a second delay time tD2, the timing control circuit 304 transfers the second control signal SCB, which controls the CPFF, from the second logic state to the first logic state, in which the CPFF is disabled, and outputs the second control signal SCB. Then, the predetermined stop signal STOP_ON is transferred from the second logic state to the first logic state.

In some embodiments, the second delay time tD2 is a time that is selected to fully discharge a charge of the virtual ground voltage VGND that was charged in the sleep mode, when the MTCMOS device is converted from the sleep mode to the active mode. The second delay time tD2 may be determined by an RC time constant of the entire virtual ground voltage VGND.

Then, the first control signal SC transitions to in the second logic state and is input to the MOS switching block CCS. The MOS switching block 104 of the MTCMOS device is then turned on to supply a current to the logic circuit block 102. Thus, the MTCMOS device goes into the active mode and the logic circuit block 102 may be operated. Also, in this state, the second control signal SCB is in the second logic state, the CPFF stores data without changing the data, and the logic circuit block recovers data before being converted to the sleep mode using the data stored in the CPFF. Then, after the second delay time tD2, the second control signal SCB is transferred from the second logic state to the first logic state. Thus the CPFF 106 is disabled.

Thus, after that the MTCMOS device is transferred to the active mode, the data stored in the CPFF is decoded and then used.

Figure 6:
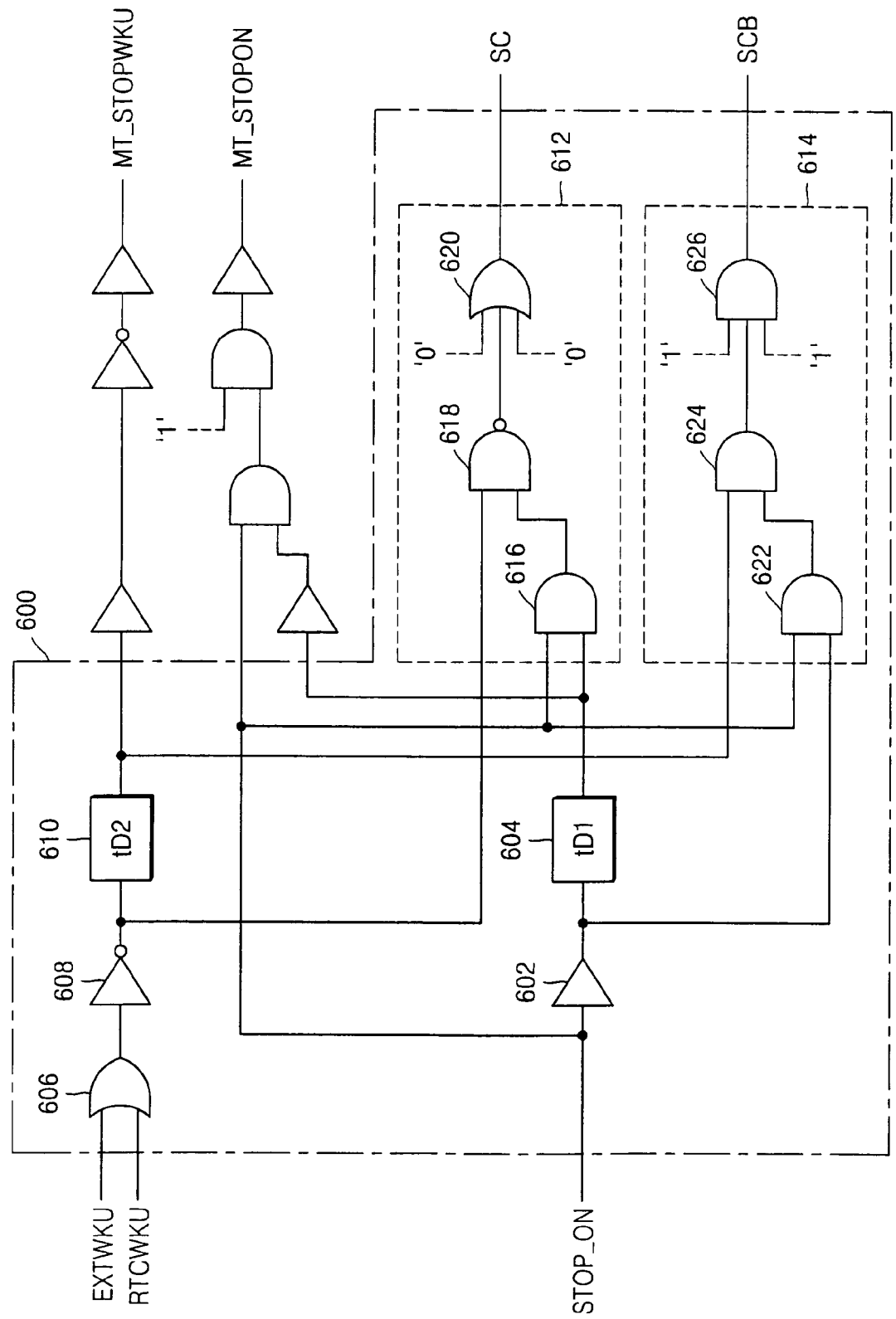
FIG. 6 is a circuit diagram illustrating a timing control circuit according to exemplary embodiments of the present invention, which can perform the operations of FIG. 5.

FIG. 6 is a circuit diagram illustrating a timing control circuit, such as a timing control circuit 304 of FIG. 4, according to exemplary embodiments of the present invention, which can perform the operations of FIG. 5.

Referring to FIG. 6, a timing control circuit 600 includes a first buffer 602 receiving an external stop signal STOP_ON, a first delay circuit 604 delaying an output signal output from the first buffer 602, a first OR gate 606 receiving first and second external wakeup signals, EXTWKU and RTCWKU, a first inverter 608 receiving a signal output from the first OR gate 606, a second delay circuit 610 delaying a signal output from the first inverter 608, a first control signal output block 612 that outputs the first control signal SC by receiving output signals of the first inverter 608 and the first delay circuit 610, and the stop signal STOP_ON, and a second control signal output block 614 that outputs the second control signal SCB, which is obtained by performing an OR operation on output signals of the first buffer 602 and the second delay circuit 610, and the stop signal STOP_ON.

The first control signal output block 612 includes a first AND gate 616 receiving the output signals of the first delay circuit 604 and the stop signal STOP_ON, a NAND gate 618 receiving output signals of the first AND gate 616 and the first inverter 608, and a second OR gate 620 that outputs the first control signal SC, which is obtained by performing an AND operation on an output signal of the first NAND gate 618 and two predetermined control signal '0's. In this case, two other input signals of the OR gate 620 are fixed in a first logic state (e.g. low level).

The second control signal output block 614 includes a second AND gate 622 receiving the output signals of the first buffer 602 and the stop signal STOP_ON, a third AND gate 624 receiving an output signal from the second AND gate 622 and an output signal of the second delay circuit 610, and a forth AND gate 626 that outputs the second control signal SCB, which is obtained by performing an AND operation on an output signal from the third AND gate 624 and two predetermined control signals '1's. In this case, other input signals of the AND gate are fixed in a second logic state (e.g. high level).

Referring to FIG. 6, when the MTCMOS device is converted from an active mode into a sleep mode, external wakeup signals EXTWKU and RTCWKU are maintained in the first logic state. When the stop signal STOP_ON is converted from the first logic state into the second logic state, the second control signal SCB is transferred from the first logic state to the second logic state. Also, the first control signal SC is transferred from the second logic state to the first logic state after being delayed by a first delay time tD1 by the first delay circuit 604.

When the MTCMOS device is switched from the sleep mode to the active mode, the stop signal STOP_ON is maintained in the second logic state. When the two wakeup signals EXTWKU and RTCWKU are switched from the first logic state to the second logic state, the first control signal SC changes from the first logic state to the second logic state, and the second control signal SCB changes from the second logic state to the first logic state after being delayed by a second delay time tD2 by the second delay circuit 610. In this case, the second delay time tD2 is a time that may be selected to completely discharge charges of the virtual ground voltage VGND line charged in the sleep mode. The second delay time tD2 may be calculated by an RC time constant of the entire virtual ground voltage.

Figure 7:
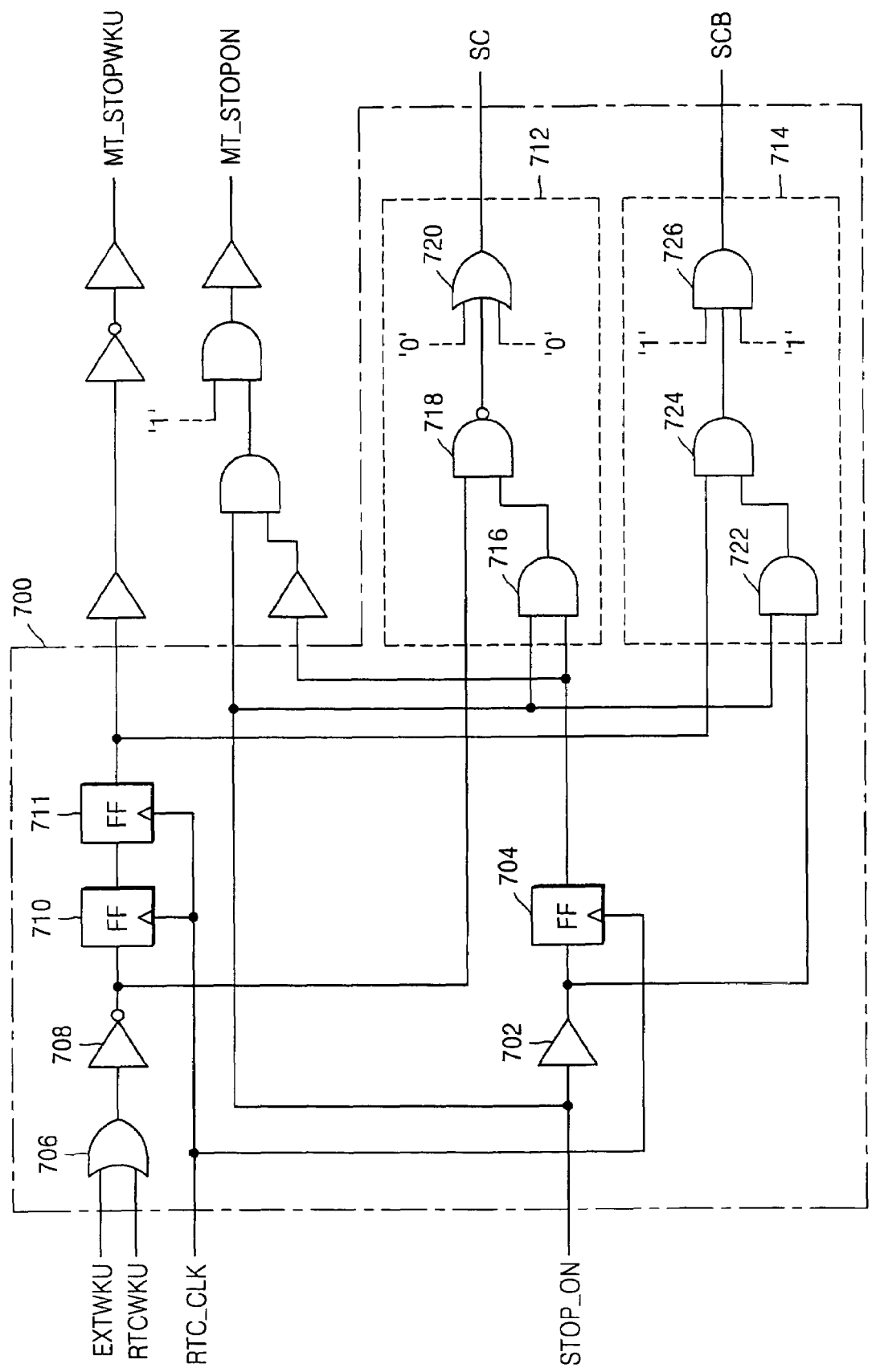
FIG. 7 is a circuit diagram illustrating a timing control circuit according to other exemplary embodiments of the present invention, which can perform the operations of FIG. 5.

FIG. 7 is a circuit diagram illustrating a timing control circuit, such as a timing control circuit 304 of FIG. 4, according to other exemplary embodiments of the present invention, which can perform the operations of FIG. 5.

Referring to FIG. 7, a timing control circuit 700 includes a first buffer 702 receiving an external stop signal STOP_ON, a first flip-flop 704 delaying a signal output from the buffer 702, a first OR gate 706 receiving first and second external wakeup signals EXTWKU and RTCWKU, a first inverter 708 receiving a signal output from the first OR gate 706, a second flip-flop 710 and a third flip-flop 711 connected in series and delaying a signal from the first inverter 708, a first control signal output block 712 that outputs the first control signal SC, which is obtained by performing an OR operation on output signals of the first inverter 708 and the first flip-flop 704 and the stop signal STOP_ON, and a second control signal output block 714 that outputs the second control signal SCB, which is obtained by performing an AND operation on output signals of the first buffer 702, and the third flip-flop 711, and the stop signal STOP_ON.

The first control signal output block 712 includes a first AND gate 716 receiving output signals of the first flip-flop 704 and the stop signal STOP_ON, a first NAND gate 718 receiving output signals of the first AND gate 716 and the inverter 708, and a second OR gate 720 that outputs the first control signal SC, which is obtained by performing an OR operation on an output signal of the first NAND gate 718 and two predetermined control signals '0'. In this case, other signals of the OR gate 720 are fixed in a first logic state (e.g. low level).

The second control signal output block 714 includes a second AND gate 722 receiving output signals of the first buffer 702 and the stop signal STOP_ON, a third AND gate 724 receiving output signals of the second AND gate 722 and the third flip-flop 711, and forth AND gate 726 that outputs the second control signal SCB, which is obtained by performing an AND operation on an output signal of the third AND gate 724 and two predetermined control signals '1'. In this case, other input signals of the AND gate 726 are fixed in a second logic state (e.g. high level). Also, a delay time via the flip-flop of FIG. 7 is determined as delayed as the period of a clock signal RTC_CLK.

In the timing control circuit shown in FIG. 7, when the MTCMOS device changes from an active mode to a sleep mode, external wakeup signals EXTWKU and RTCWKU maintain the first logic state. When the stop signal STOP_ON is converted from the first logic state into the second logic state, the second control signal SCB is transferred from the first logic state to the second logic state. The first control signal SC is transferred from the second logic state to the first logic state, and delayed by a first delay time tD1 by the first flip-flop 704.

When the MTCMOS device is converted from the sleep mode to the active mode, the stop signal STOP_ON maintains the second logic state. When the wakeup signals EXTWKU and RTCWKU are converted from the first logic state into the second logic state, the first control signal SC is transferred from the first logic state to the second logic state, the second control signal SCB is transferred from the second logic state to the first logic state, delayed as a second delay time tD2 by the second delay circuit 710. In this case, the second delay time tD2 may be a time selected to be the virtual ground voltage VGND charged in the sleep mode to be completely discharged, and may be calculated considering the RC time constant of an entire virtual ground network.

MTCMOS devices according to embodiments of the present invention can provide that a signal controlling the MTCMOS device is controlled by a proper delay time in each conversion mode, thereby storing data accurately when the MTCMOS device is converted to a sleep mode. Moreover, when the MTCMOS device is converted to an active mode, charge may be discharged fully so that data is not lost. Accordingly, power consumption can be reduced or minimized, and the MTCMOS device may be controlled during the operation of the MTCMOS device.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A Multi-Threshold Complementary Metal Oxide Semiconductor (MTCMOS) device comprising:
   a high threshold voltage current control switch that is responsive to a first control signal;
   a low threshold voltage logic circuit;
   a flip flop that is configured to store data for the low threshold voltage logic circuit and that is responsive to a second control signal; and
   a control circuit that is configured to change a logic state of the second control signal from a first logic state to a second logic state and, after a predetermined delay time tD1, to change a logic state of the first control signal from the second logic state to the first logic state such that the first and second control signals are both at the second logic state for the predetermined delay time tD1 when the MTCMOS device is converted from an active mode to a sleep mode, and is further configured to change the logic state of the first control signal from the first logic state to the second logic state and, after a predetermined delay time tD2 that is different from tD1, to change the logic state of the second control signal from the second logic state to the first logic state such that the first and second control signals are both at the second logic state for the predetermined delay time tD2 when the MTCMOS device is converted from the sleep mode to the active mode.

2. The MTCMOS device of claim 1, wherein the control circuit is further configured to convert the MTCMOS device from the sleep mode into the active mode in response to predetermined wakeup signals EXTWKU and RTCWKU, and to convert the MTCMOS device from the active mode into the sleep mode in response to a predetermined stop signal STOP_ON.

3. The MTCMOS device of claim 1, wherein:
   the first control signal turns the current control switch on in the second logic state, and turns the current control switch off in the first logic state; and
   the second control signal stores data for the logic circuit via the flip-flop in the second logic state, and disables the flip-flop in the first logic state.

4. A Multi-Threshold Complementary Metal Oxide Semiconductor (MTCMOS) comprising:
   a high threshold voltage current control switch that is responsive to a first control signal;
   a low threshold voltage logic circuit;
   a flip flop that is configured to store data for the low threshold voltage logic circuit and that is responsive to a second control signal; and
   a control circuit that is configured to change a logic state of the second control signal from a first logic state to a second logic state and, after a predetermined delay time tD1, to change a logic state of the first control signal from the second logic state to the first logic state when the MTCMOS device is converted from an active mode to a sleep mode, and is further configured, when the MTCMOS device is converted from the sleep mode to the active mode, to change the logic state of the first control signal from the first logic state to the second logic state and, after a predetermined delay time tD2 that is different from tD1, to change the logic state of the second control signal from the second logic state to the first logic state, wherein the control circuit is further configured to convert the MTCMOS device from the sleep mode into the active mode in response to predetermined wakeup signals EXTWKU and RTCWKU, and to convert the MTCMOS device from the active mode into the sleep mode in response to a predetermined stop signal STOP_ON, and wherein the control circuit comprises:
   a first buffer configured to receive the external stop signal STOP_ON;
   a first delay circuit configured to delay a signal output from the first buffer;
   a first OR gate configured to receive the first external wakeup signal EXTWKU and the second external signal wakeup RTCWKU;
   a first inverter configured to receive a signal output from the first OR gate;
   a second delay circuit configured to delay a signal output from the first inverter;
   a first control signal output block configured to output the first control signal, by performing at least one logic operation on the stop signal STOP_ON and an output signal of the first delay circuit; and
   a second control signal output block configured to output the second control signal by performing at least one logic operation on the stop signal and an output signal of the second delay circuit.

5. The MTCMOS device of claim 4, wherein the first delay circuit comprises a single flip-flop, and the second delay circuit comprises a plurality of flip-flops connected in series.

6. The MTCMOS device of claim 4, wherein the first control signal output block comprises:
   a first AND gate configured to receive the stop signal and the output signal of the first delay circuit;
   a first NAND gate configured to receive output signals of the first AND gate and the first inverter; and
   a second OR gate configured to output the first control signal by receiving an output signal of the first NAND gate and two predetermined control signals.

7. The MTCMOS device of claim 4, wherein the second control signal output block comprises:

a second AND gate configured to receive the stop signal and the output signal of the first buffer;

a third AND gate configured to receive output signals of the second AND gate and the second delay circuit; and a forth AND gate configured to output the second control signal by receiving an output signal of the third AND gate and two predetermined control signals.

8. The MTCMOS device of claim 5, wherein the first control signal output block comprises:

a first AND gate configured to receive the stop signal and the output signal of the first delay circuit;

a first NAND gate configured to receive output signals of the first AND gate and the first inverter; and a second OR gate configured to output the first control signal by receiving an output signal of the first NAND gate and two predetermined control signals.

9. The MTCMOS device of claim 5, wherein the second control signal output block comprises:

a second AND gate configured to receive the stop signal and the output signal of the first buffer;

a third AND gate configured to receive output signals of the second AND gate and the second delay circuit; and a forth AND gate configured to output the second control signal by receiving an output signal of the third AND gate and two predetermined control signals.

10. A Multi-Threshold Complementary Metal Oxide Semiconductor (MTCMOS) device comprising:

a high threshold voltage current control switch that is responsive to a first control signal;

a low threshold voltage logic circuit;

a flip flop that is configured to store data for the low threshold voltage logic circuit and that is responsive to a second control signal;

a control circuit configured to transfer the second control signal from a first logic state to a second logic state, and to transfer the first control signal from the second logic state to the first logic state after a predetermined delay time tD1 when the MTCMOS device is converted into the sleep mode, the control circuit comprising:

a timing control circuit configured to transfer the first control signal from the first logic state to the second logic state and to transfer the second control signal from the second logic state to the first logic state when the MTCMOS is converted into the active mode; and an initialization control circuit configured to initialize a reset flip-flop, to initialize the first control signal to the second logic state via signals output from the reset flip-flop, and to initialize the second control signal to the first logic state, upon initialization of the MTCMOS device.

11. The MTCMOS device of claim 10, wherein the control circuit is further configured to convert the MTCMOS device from the sleep mode into the active mode in response to predetermined wakeup signals EXTWXU and RTCWKU, and to convert the MTCMOS device from the active mode into the sleep mode in response to a predetermined stop signal STOP_ON.

12. The MTCMOS device of claim 10, wherein:

the first control signal turns the current control switch on in the second logic state and turns the current control switch off in the first logic state; and the second control signal stores data for the logic circuit via the flip-flop in the second logic state and disables the flip-flop in the first logic state.

13. A MTCMOS device of claim 10:

wherein the low threshold voltage logic circuit is connected between a first power source voltage and a first operational voltage, is configured to perform an operation or function, and includes a MOS transistor with a low voltage level Vth; and wherein the high threshold voltage current control switch is connected between the first operational voltage and a second power source voltage, is configured to control current flow in response to the first control signal, and includes a high voltage level Vth transistor.

14. A method of controlling an active mode and a sleep mode of a Multi-Threshold Complementary Metal Oxide Semiconductor (MTCMOS) device, the method comprising:

transferring a stop signal STOP_ON that converts the MTCMOS device to a sleep mode to a second logic state;

transferring a second control signal that controls a flip-flop for storing data for a logic circuit block of the MTCMOS device to a second logic state, in response to the stop signal; and transferring a first control signal that controls a current flow of the MTCMOS device to a first logic state after a first predetermined delay from when the second control signal is transferred to the second logic state such that the first and second control signals are both at the second logic state during the first predetermined delay in response to the MTCMOS device entering the sleep mode;

producing predetermined wakeup signals EXTWKU and RTCWKU including a pulse in the second logic state having a predetermined width;

transferring the first control signal that controls the current flow of the MTCMOS device to the second logic state in response to the predetermined wakeup signals;

transferring the second control signal that controls the flip-flop block for storing data for the logic circuit block of the MTCMOS device to the first logic state after a second predetermined delay time from when the first control signal is transferred to the second logic state such that the first and second control signals are both at the second logic state during the second predetermined delay in response to the MTCMOS device entering the active mode; and transferring a stop signal STOP_ON that converts the MTCMOS device to a sleep mode, to the first logic state.

15. A Multi-Threshold Complementary Metal Oxide Semiconductor (MTCMOS) device comprising:

a high threshold voltage current control switch that is responsive to a first control signal;

a low threshold voltage logic circuit;

a flip flop that is configured to store data for the low threshold voltage logic circuit and that is responsive to a second control signal; and a control circuit that is configured to change a logic state of the second control signal and then, after a first delay, to change a logic state of the first control signal, such that the first and second control signals are both at a same logic state during the first delay in response to the MTCMOS device entering a sleep mode, and further configured to change to change the logic state of the first control signal and then, after a second delay that is different from the first delay, to change the logic state of the second control signal, such that the first and second control signals are both at the same logic state during the second delay in response to the MTCMOS device entering an active mode.

16. The MTCMOS device of claim 15 wherein the second delay is longer than the first delay.

17. The MTCMOS device of claim 15 wherein the control circuit is configured to change the logic state of the second control signal from a first logic state to a second logic state and then, after a first delay, to change a logic state of the first control signal from the second logic state to the first logic state, in response to the MTCMOS device entering a sleep mode, and is further configured to change the logic state of the first control signal from the first logic state to the second logic state and then, after a second delay that is different from the first delay, to change the logic state of the second control signal from the second logic state to the first logic state, in response to the MTCMOS device entering an active mode.

18. A method of controlling a Multi-Threshold Complementary Metal Oxide Semiconductor (MTCMOS) device that comprises a high threshold voltage current control switch that is responsive to a first control signal, a low threshold voltage logic circuit, and a flip flop that is configured to store data for the low threshold voltage logic circuit and that is responsive to a second control signal, the method comprising:

changing a logic state of the second control signal and then, after a first delay, changing a logic state of the first control signal, such that the first and second control signals are both at a same logic state during the first delay in response to the MTCMOS device entering a sleep mode; and changing the logic state of the first control signal and then, after a second delay that is different from the first delay, changing the logic state of the second control signal, such that the first and second control signals are both at the same logic state during the second delay in response to the MTCMOS device entering an active mode.

19. The method of claim 18 wherein the second delay is longer than the first delay.

20. The method of claim 18:

wherein changing a logic state of the second control signal and then, after a first delay, changing a logic state of the first control signal, in response to the MTCMOS device entering a sleep mode comprises changing the logic state of the second control signal from a first logic state to a second logic state and then, after a first delay, changing a logic state of the first control signal from the second logic state to the first logic state, in response to the MTCMOS device entering a sleep mode; and wherein changing the logic state of the first control signal and then, after a second delay that is different from the first delay, changing the logic state of the second control signal, in response to the MTCMOS device entering an active mode comprises changing the logic state of the first control signal from the first logic state to the second logic state and then, after a second delay that is different from the first delay, changing the logic state of the second control signal from the second logic state to the first logic state, in response to the MTCMOS device entering an active mode.

* * * * *

UNITED STATES PATENT AND TRADEMARK OFFICE
CERTIFICATE OF CORRECTION

PATENT NO. : 7,215,155 B2  Page 1 of 1
APPLICATION NO. : 10/996084
DATED : May 8, 2007
INVENTOR(S) : Won It is certified that error appears in the above-identified patent and that said Letters Patent is hereby corrected as shown below:

In The Claims:

Column 13, Claim 9, Line 24:   Please correct "forth"
                                To read -- fourth--

Column 13, Claim 11, Line 57:  Please correct "EXTWXU"
                                To read -- EXTWKU--

Signed and Sealed this

Fourteenth Day of August, 2007

JON W. DUDAS
*Director of the United States Patent and Trademark Office*